(12) United States Patent
Sarma et al.

(10) Patent No.: US 8,359,562 B2
(45) Date of Patent: Jan. 22, 2013

(54) SYSTEM AND METHOD FOR SEMICONDUCTOR DEVICE FABRICATION USING MODELING

(75) Inventors: Chandrasekhar Sarma, Poughkeepsie, NY (US); Todd C. Bailey, Poughkeepsie, NY (US)

(73) Assignees: Infineon Technologies AG, Neubiberg (DE); International Business Machines Corporation, Armonk, NY (US)

( * ) Notice: Subject to any disclaimer, the term of this patent is extended or adjusted under 35 U.S.C. 154(b) by 75 days.

(21) Appl. No.: 13/004,562

(22) Filed: Jan. 11, 2011

(65) Prior Publication Data

US 2012/0179282 A1 Jul. 12, 2012

(51) Int. Cl.
*G06F 17/50* (2006.01)

(52) U.S. Cl. ..................................... 716/110

(58) Field of Classification Search .............. 716/100, 716/110

See application file for complete search history.

(56) References Cited

U.S. PATENT DOCUMENTS

| 5,889,686 | A | * | 3/1999 | Mimotogi et al. ............... 703/2 |
| 6,327,555 | B1 | * | 12/2001 | Shimizu et al. ................. 703/12 |
| 7,921,383 | B1 | * | 4/2011 | Wei .................................. 716/54 |
| 2005/0118515 | A1 | * | 6/2005 | Progler et al. ................... 430/5 |
| 2006/0222975 | A1 | * | 10/2006 | Ke et al. .......................... 430/30 |
| 2009/0021718 | A1 | * | 1/2009 | Melville et al. ................. 355/70 |
| 2010/0151364 | A1 | * | 6/2010 | Ye et al. ............................. 430/5 |
| 2010/0183963 | A1 | * | 7/2010 | Zable et al. ..................... 430/30 |
| 2011/0161895 | A1 | * | 6/2011 | Reid et al. ....................... 716/53 |
| 2011/0188732 | A1 | * | 8/2011 | Stroessner ..................... 382/144 |
| 2011/0224963 | A1 | * | 9/2011 | Isoyan et al. .................... 703/14 |
| 2012/0021343 | A1 | * | 1/2012 | Ye et al. ............................. 430/5 |
| 2012/0158384 | A1 | * | 6/2012 | Wei ................................... 703/2 |

OTHER PUBLICATIONS

Sarma, C., et al., "3D physical modeling for patterning process development," Proceedings vol. 7641, Apr. 2, 2010, 9 pages.

Talbi, M., et al., "Profile-based pattern verification using three-dimensional physical photo resist models,"Proceedings vol. 7640, Mar. 12, 2010, 13 pages.

* cited by examiner

*Primary Examiner* — Suchin Parihar
(74) *Attorney, Agent, or Firm* — Slater & Matsil, L.L.P.

(57) ABSTRACT

In one embodiment, a method of manufacturing a semiconductor device includes using a processor to generate a first three dimensional (3-D) resist profile for a first process condition using an layout mask of a target structure. The method further includes using a processor to generate a second 3-D resist profile for a second process condition using the layout mask. The first process condition includes a plurality of process variables, and the second process condition includes different values of the plurality of process variables than the first process condition. The method includes generating a 3-D process variable (PV) band profile by combining the first 3-D resist profile with the second 3-D resist profile and displaying a 3-D image of the 3-D PV band profile on a display.

35 Claims, 7 Drawing Sheets

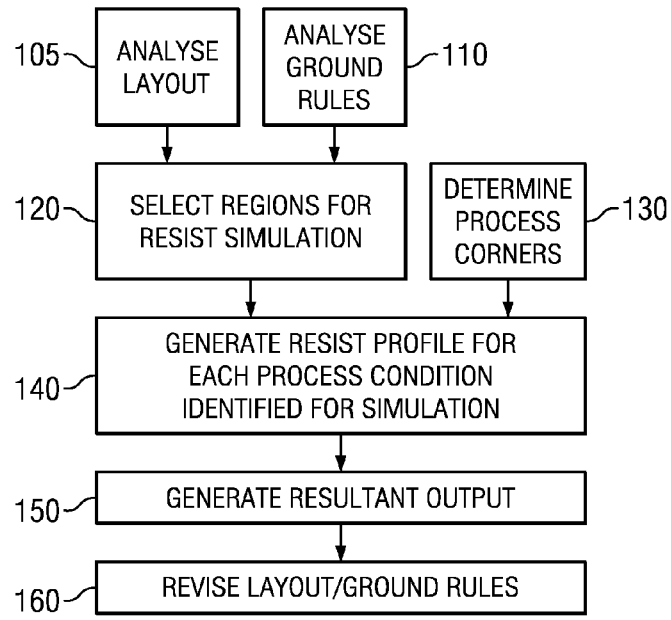
*FIG. 1*
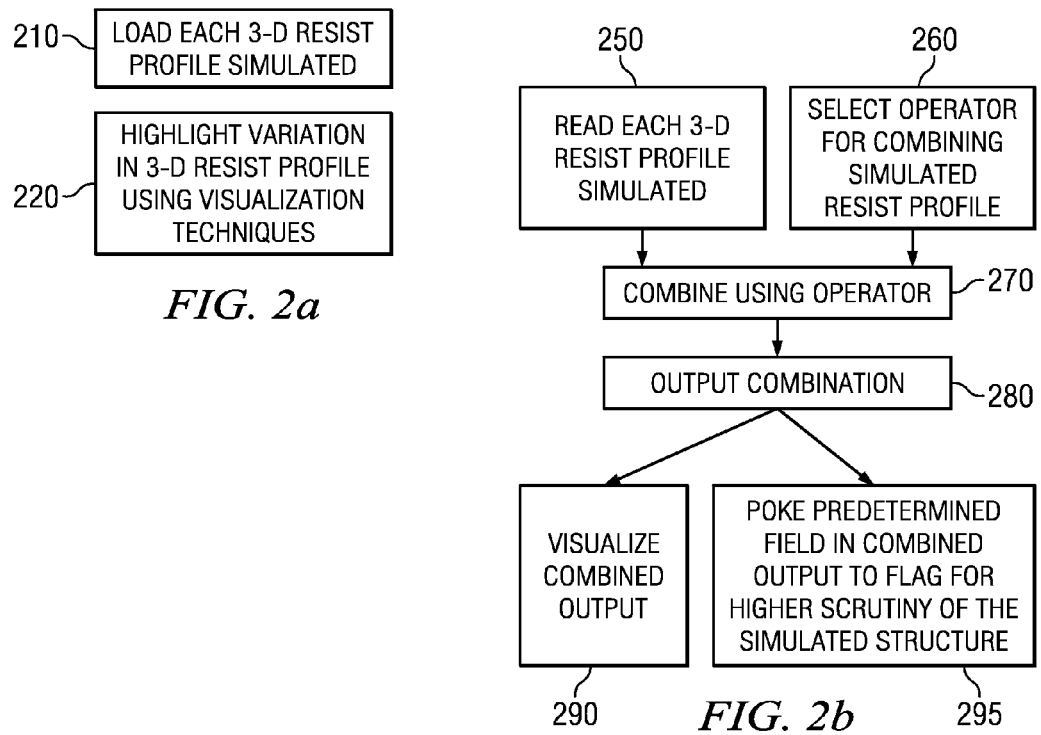
*FIG. 2a*   *FIG. 2b*

SYSTEM AND METHOD FOR SEMICONDUCTOR DEVICE FABRICATION USING MODELING

TECHNICAL FIELD

The present invention relates generally to semiconductor devices, and more particularly to a system and method for semiconductor device fabrication and design verification using modeling.

BACKGROUND

The accurate reproduction of patterns on the surface of a semiconductor substrate is critical to the proper fabrication of semiconductor devices. The semiconductor substrate may have undergone previous fabrication processes and may already feature layers and structures created by those fabrication processes. Improperly reproduced patterns can result in semiconductor devices that do not operate to design specifications or do not operate at all. For example, transistors can be created with improperly sized gates, conductors can be created that are short circuited or open circuited with other conductors or devices, structures can be created with wrong geometries, and so forth. Improperly reproduced patterns can reduce the yield of the fabrication process, thereby increasing the overall cost of the product. The reproduction process typically involves the use of optical lithography to reproduce the patterns onto the surface of the semiconductor substrate that is subsequently followed with a variety of processes to either subtract (for example, etch) and add (for example, deposit) materials from and to the semiconductor substrate.

However, as the dimensions of the structures making up the patterns continue to become smaller, their sizes approach (in some cases, the dimensions of the structures are smaller than) the wavelength of the light used in optical lithography, the interference and processing effects can cause distortions and deviations in the patterns as they are reproduced onto the semiconductor substrate. Such distortion becomes quite complex in current lithographic systems where the structures being imaged are much smaller than the wavelength of the light used (e.g., 20 nm structures may be patterned using 193 nm wavelength). In addition to the relationship between structures of the patterns and the wavelengths of the light, other factors that can cause distortion include the numerical aperture of the imaging system, the minimum pitch between structures in the pattern, and normal levels of photolithography process variation. The result being a reproduced pattern having a dramatically different appearance from the pattern being reproduced, also known as the intended pattern. The distortions and deviations in the reproduced pattern are dependent upon the characteristics of the pattern, such as the shape and size of the structures in the pattern, the presence of neighboring patterns and structures around the pattern, as well as the process conditions. For example, the interactions of the light with the structures making up a pattern can result in the reproduced pattern having rounded corners, bulges towards another elements, and so forth.

Hence, methods for correcting these and other unwanted effects are required.

SUMMARY OF THE INVENTION

These and other problems are generally solved or circumvented, and technical advantages are generally achieved, by illustrative embodiments of the present invention.

In accordance with an embodiment of the present invention, a method of manufacturing a semiconductor device comprises using a processor to generate a first three dimensional (3-D) resist profile for a first process condition using an layout mask of a target structure. The method further comprises using a processor to generate a second 3-D resist profile for a second process condition using the layout mask. The first process condition comprises a plurality of process variables, and the second process condition comprises different values of the plurality of process variables than the first process condition. The method includes generating a 3-D process variable (PV) band profile by combining the first 3-D resist profile with the second 3-D resist profile and displaying a 3-D image of the 3-D PV band profile on a display.

In accordance with an alternative embodiment of the present invention, a method of manufacturing a lithographic mask comprises using a processor to generate a first three dimensional (3-D) resist profile for a first process condition using an layout mask of a target structure. The method further comprises using a processor to generate a second 3-D resist profile for a second process condition using the layout mask. The first process condition comprises a plurality of process variables, and the second process condition comprises different values of the plurality of process variables than the first process condition. The method includes using a binary operation in a processor to generate a 3-D process variation (PV) band profile by combining the first and the second 3-D resist profiles.

In accordance with an alternative embodiment of the present invention, a method of manufacturing a semiconductor device comprises using a processor to generate a plurality of process conditions having a plurality of process variables. Each process condition of the plurality of process conditions is different from another process condition of the plurality of process conditions by a value of at least one process variable of the plurality of process variables. The method further includes using a processor to generate a plurality of three dimensional (3-D) resist profiles for the plurality of process conditions using an layout mask of a target structure. The method further comprises generating a 3-D process variable (PV) band profile by combining the plurality of 3-D resist profiles, and displaying a 3-D image of the 3-D PV band profile on a display.

In accordance with an alternative embodiment of the present invention, a non-transitory computer-readable storage medium comprises an executable program which instructs a processor to generate a first three dimensional (3-D) resist profile for a first process condition using an layout mask of a target structure. The program further instructs the processor to generate a second 3-D resist profile for a second process condition using the layout mask. The first process condition comprises a plurality of process variables, and the second process condition comprises different values of the plurality of process variables than the first process condition. The program further instructs a processor to generate a 3-D process variation (PV) band profile comprising the first and the second 3-D resist profiles.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1 illustrates a flow chart of processes prior to mask fabrication in accordance with an embodiment of the invention;

FIG. 2, which includes FIGS. 2a and 2b, illustrates different embodiments, of combining 3-D resist profiles;

FIG. 4, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 3:
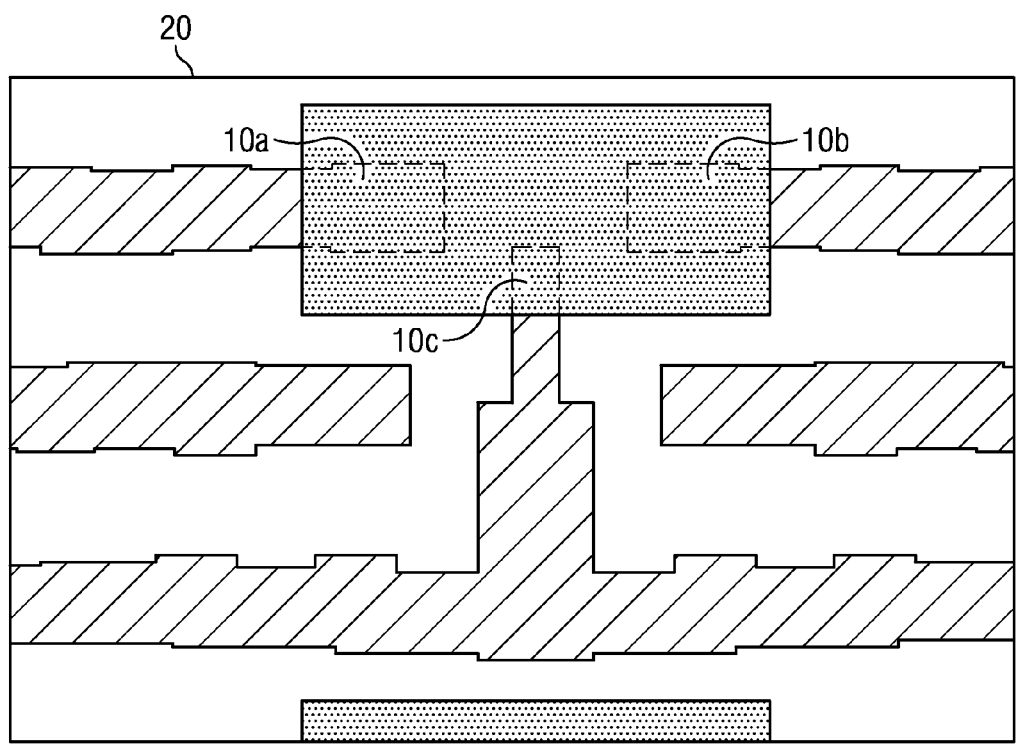
FIG. 3 is an illustrative mask layout selected for the simulation.

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

With the scaling down of technology, it is no longer possible to use lithography and etch simulations independently because of close coupling between these processes. Further, three dimensional (3-D) aspects of the patterned resist such as the bottom critical dimension of lithographic patterns, the resist profile, the resist loss at the top and top rounding play a vital role in subsequent etch process. Two dimensional (2-D) wafer plane models with implicit assumptions of straight (vertical) profiles may fail to account critical phenomenon that can result in patterns being produced of incorrect dimensions, which can dramatically impact product yield. Therefore, combined 3-D modeling of lithography and etch process has become necessary. In particular, these 3-D models must be realistic or physical so as to mimic real wafer phenomena. However, there is also a need to efficiently process the larger amount of information generated by such 3-D simulations.

In various embodiments, the present invention includes a new way to visualize lithographic process variations in 3-D space. This technique may be used to analyze 3-D simulation results. Embodiments of the invention can thus facilitate ground rule development, layout optimization, and process optimization. This is because such visualization helps to determine effects of certain ground rules in the entire process space. For example, after visualizing lithographic process variations in 3-D space, ground rules or specific layouts may be changed to improve the process margin.

These visualizations referred herein as 3-dimensional process variation bands enable visualization of 3D contours in one image for a large numbers of process parameters. Embodiments of the invention include methodology for generating such lithographic process variation (PV) bands in 3-dimensions. These 3-D PV bands may be generated based on calibrated resist models. The 3-D PV bands overcome the limitations of 2-D PV bands, which are generated for a fixed resist height assuming vertical resist profiles. Such 2-D PV bands may fail to catch phenomenon occurring on a different plane. For example, resist loss at the top, top rounding, resist bridging near the bottom of the resist that may become important at constrained geometries can not be simulated without using 3-D resist simulation.

3-D depiction of process variation ahead of mask manufacture also could shorten the technology development cycle substantially. This is because by adjusting the mask before fabrication, costly errors in the mask are avoided even before the masks are fabricated. In various embodiments, the model and the corresponding visualization are automated in a data preparation flow to flag issues or dispose critical structures in a robust way.

Embodiments of the invention will be described using the flow charts of FIGS. 1 and 2 and corresponding structures of FIGS. 3-5.

FIG. 1 illustrates a flow chart of processes prior to mask fabrication in accordance with an embodiment of the invention.

Referring to FIG. 1, the process operations begin by selecting an area to be simulated. In various embodiments, the process operations of FIG. 1 may be performed either before or after optical proximity corrections are performed. In one embodiment, this area is selected by analyzing a layout generated by a design team prior to mask fabrication (step 105). The design team may establish a target structure having a target dimensions to be fabricated. In various embodiments, a prior simulation, e.g., a 2-D simulation of the resist profile, may be used to detect hotspots e.g., regions that are more likely to fail.

In an alternative embodiment, the area to be selected may be based on the ground rules (step 110). For example, the tightest allowed pitch and density spacing (or some other worst case structure) from the ground rule specification may be selected to form an illustrative structure. This avoids the need to search for hotspot regions in a layout. Rather, before the layout is generated, the ground rules can be revised as described below avoiding iteration of the layout between the lithography and design teams.

Thus, as illustrated in step 120, the region having the structures to be simulated is finalized and a digital mask of the region to be simulated is made. In one embodiment, this digital mask is altered to account for the effects of post-lithographic (e.g. reactive ion etch) processing, thereby biasing part or all of the digital mask shapes. Next, as illustrated in step 130, process corners are determined. Process corners may represent the maximum expected variation of a process. In one embodiment, a process corner may be a plus two sigma (+2σ) variation from a median of a process variable based on typical statistical variation of that variable. If one corner is selected at +2σ, then another process corner may be selected to include a minus two sigma (−2σ) variation from a median of the process variable. Alternatively, other variations may be selected such as plus three sigma (+3σ)/minus three sigma (−3σ).

In various embodiments, a plurality of process corners may be selected for the resist simulations. In various embodiments, many different types of design of experiments (DoE) scenarios may be used to generate a set of process conditions to be simulated. For example, in one embodiment, if four process variables are selected, 16 (4×4) process conditions may be generated thereby requiring generating 16 3-D resist profiles. In various embodiments, more or less number of process variables may be selected for the simulations thereby making the DoE matrix smaller or larger. For example, in one embodiment, for a process having N variables, 2N process corners may be used for the simulations. Alternatively, 2N+1 process conditions may be simulated so that the center point or a reference point may also be simulated. In various embodiments, N is less than 50, and less than 10 in one embodiment. Examples of process variables may include exposure time, intensity of exposure (dose), focus, mask bias, variations in the resist such as thickness and/or other properties within the resist, mask uniformity, line edge placement variations, post develop bake temperature, source non uniformity, numerical aperture variations, coherence of exposure source etc.

In another embodiment, combinations of process variables may be used to estimate process conditions likely to result in maximum variation (deviation) in the resist profiles. This may also help to reduce the number of simulations being performed.

As next illustrated in step 140, a 3-D resist profile is generated for each process condition selected in step 130. In generating the 3-D resist profile, a 3-D structure file is first generated. The initial 3-D structure file may include a blanket photo resist layer. Next, using the digital mask of step 120, exposure of the blanket photo resist layer is simulated. In various embodiments, substantially all proximity effects during lithographic exposure, bake, development, and etching are simulated. In some embodiments, optical proximity effects that are handled during optical proximity correction (OPC) are not modeled. This allows this process to be separated from the OPC process. In some embodiments, the 3-D resist profiles may be simulated after optical proximity corrections have been performed on the layout. In such embodiments, all optical proximity effects are simulated.

The exposure creates a latent image in the photo resist that is developed in the simulator. A post exposure bake may be optionally simulated. Next, the simulation of the resist development is accomplished. Detailed models of the chemical interactions between the exposed resist layer with the developer may be incorporated so as to accurately model the etching effects, particularly proximity effects. The development, which etches the photo resist layer, forms a 3-D pattern by removing unexposed regions of the photo resist layer.

In various embodiments, different levels of complexity may be used in modeling the above processes. In some embodiments, all physical processes are modeled in as much depth as possible. In such embodiments, the physical processes are simulated as opposed to curve fitting of the data, e.g., based on polynomials. For example, in various embodiments, the time/temperature-dependent chemical reactions within exposed photo resist layers are simulated such that the solubility of the photo resist changes towards a particular solvent. Similarly, the dissolution of soluble photo resist in that particular solvent may be simulated.

In other embodiments, some processes may be empirically modeled. Therefore, the use of empirical models can help to reduce the computational complexity of including every single physical phenomenon occurring during the photo resist profile evolution. In either method, calibration of the models is a prerequisite. Calibrating models over a wide range of standard experiments can help to reduce the need to include more detailed physics.

In various embodiments, these 3-D resist models may be calibrated over a large set of process window datasets (data collected at different process variations such as different defocus/dose) to ensure their accuracy. In addition, the resist models may be calibrated using an extensive dataset comprising critical dimensions and profiles of structures covering a large design space for different process conditions.

Once a model is built, the accuracy of the model is verified on wafer data collected at different process conditions. Once verified to work well, the model is then used to predict resist shapes, profiles and critical dimensions for a given design before wafer fabrication is done. In another embodiment a resist model could be extrapolated, i.e. not calibrated, to emulate the physical response of new optical or material technologies to the process conditions.

After the step described in step 140, a plurality of 3-D resist profiles are generated for each process condition (process corner) being simulated (step 150). The plurality of 3-D resist profiles are combined as will be described in more detail in FIG. 2.

The combined result is used to determine if the selected structure conforms with the target feature (step 160). For example, the combined result may show that resist bridging is likely at some process conditions and therefore, the target feature will not pattern consistently in a manufacturing environment. Therefore, the layout must be revised before mask fabrication.

Alternatively, the ground rules for generating layouts must be revised so that this simulated feature is not allowed to be designed in the mask layout or the given design needs to be modified for intended functionality on the wafer. Advantageously tuning the ground rules/OPC at the beginning of a process development process may reduce development cycle time.

Embodiments of the invention may be implemented in a processor of a computing process unit. In one embodiment, both the 3-D resist profile calculation and the subsequent visualization/post processing may be performed in the same computing process unit, e.g., the same processor. In an alternative embodiment, different process condition i.e. process corners may be simulated in different processors so that the different 3-D resist profiles may be computed in parallel. In other embodiments, the computation of the 3-D resist profiles may be performed in a different computing process unit than the visualization/post processing of the different 3-D resist profiles. For example, the post-processing/visualization may be performed in a desktop or laptop unit having a general purpose processor. In some embodiments, the computation of the 3-D resist profiles may be performed in a networked computer having for example, a plurality of processors. Alternatively, each portion of the 3-D resist profile calculation may be performed in a different processor. In some embodiments, different portions of the intermediate target layout may be sub-divided and the sub-units may be computed in different processors in parallel thus improving the computing efficiency.

FIG. 2, which includes FIGS. 2*a* and 2*b*, illustrates different embodiments of combining 3-D resist profiles.

In the embodiment illustrated in FIG. 2a, simulations results from multiple process variations are plotted in a single 3-D image. Referring to FIG. 2a, the 3-D resist profile generated for a plurality of process conditions may be combined visually in one embodiment. The 3-D resist profiles are loaded into a plotting program or visualization software (step 210).

Next, the plot attributes of each of the 3-D resist profiles are selectively adjusted thereby forming a combined 3-D image. As illustrated in step 220, variations between the 3-D resist profiles are highlighted in the combined 3-D image. For example, the coordinate points of a first resist profile may be mapped onto the coordinate points of a second resist profile (the coordinate points being absolute e.g., relative to the location of the layout mask). In other words, the two or more structures files may be completely merged without translating the structure. This enables a user to visualize all the results simultaneously.

As an example, a first 3-D resist profile may be made opaque while a second 3-D resist profile may be made transparent. Hence, any region of the second 3-D resist profile larger than (or outside) the first 3-D resist profile can be identified.

In various embodiments, impact of process variations may be color coded differently to identify variations between the different 3-D resist profiles. The combined 3-D image may be rotated around any axis for viewing.

The above operations for producing the combined 3-D image, which are performed in the visualization software may be automated, for example, by writing a script within the visualization software. This avoids individual tailoring of these plots after each simulation run.

FIG. 3-4 illustrate this embodiment of FIG. 2a schematically.

FIG. 2b illustrates an alternative embodiment of generating the combined output as described in step 150 of FIG. 1.

FIG. 2b illustrates an embodiment in which the different 3-D resist profiles are combined mathematically and therefore completely digitally, e.g., in one embodiment without further manual input. Referring to step 250 of FIG. 2b, each of the simulated 3-D resist profiles are loaded, e.g., into memory of a computing unit. Alternatively, in various embodiments, the simulated 3-D resist profiles may be read sequentially when the subsequent mathematical operation is performed.

The mathematical operation is selected as shown in step 260. In various embodiments, the mathematical operation may be predetermined. The mathematical operation is applied to combine the different 3-D resist files. In various embodiments, the mathematical operation may include logic operators such as XOR, OR, AND, NAND, as well requirements such as IF operator which may require that certain conditions be met.

In one embodiment, the mathematical operation comprises a XOR logic. Therefore, the combined resist profile includes only features that are in the first or the second resist profiles but not in both the first and the second resist profiles. In another embodiment, the part of the resist in three dimensions that remains constant between the first and second resist profile can be represented after combining the first and second resist profile with, e.g. a AND logic.

The mathematical operator is applied to generate a combined output (steps 270 and 280). The combined resist profile may be visualized (step 290) in one embodiment. The visualization may be performed in 1-D, 2-D, or 3-D depending on the mathematical operator used and the resulting output.

In another embodiment, as described in step 295, the combined output may be digitally poked to generate a flag indicating the possible failure of the target structure if fabricated. For example, certain areas with the combined output may be digitally analyzed to see if a predetermined criterion is satisfied.

FIG. 3 illustrates a layout selected for the simulation in accordance with an embodiment of the invention.

FIG. 3 illustrates an intermediate layout of a target design to be fabricated. The intermediate layout includes the approximate position and dimensions of target structures, which may be adjusted further before making the mask, as described below. In various embodiments, the position and dimensions of target structures on the intermediate layout are corrected or changed to a final layout. The final layout ensures that target features are fabricated during subsequent manufacturing within acceptable manufacturing process tolerances. For example, after the corrections, features corresponding to the target dimensions and design rules can be manufactured. Thus embodiments of the invention enable improvements in process yield.

In various embodiments, only portions of the intermediate layout are chosen for further simulation (see also description with regard to step 105 in FIG. 1). In particular, instead of simulating the complete layout, certain portions of the intermediate layout are simulated. In various embodiments, certain portions of the intermediate layout that are likely to produce shorts, bridging, or other defects will be selected for further review using the embodiments described below. These portions of the intermediate layout may be selected based on various means including a 2-D simulation, contour simulation, rule based selection, for example. Selecting a smaller region of the intermediate layout for further 3-D simulation significantly reduces the computational overhead and complexity. Thus, the features that are likely to fail are more thoroughly examined without introducing significant computational overhead.

The illustrated layout of FIG. 3, a first region 20 of the layout is selected, which has target features 10. In one embodiment, the target features 10 comprise lines on the gate design level. In other embodiments, the target features 10 may comprise other features such as contact holes, vias, metal lines etc. As an example, the first region 20 is selected because of the close alignment of the first feature 10a, the second feature 10b, and the third feature 10c.

As described above, the chosen first region 20 of the layout is simulated in 3-D using a physical resist model. The simulation first generates an initial structure file of a workpiece with a photo resist layer disposed over it. Then, using the first region 20 of the layout as a mask, the lithographic exposure is simulated. Thus, in the initial structure file, an area of the photo resist layer corresponding to the first region 20 is exposed. The simulator next emulates the physical processes corresponding to resist bake (if any) and development. The developed portion of the photo resist layer is etched. The simulator may refine the grid of the initial structure file to improve the accuracy of the simulation during any of the above steps. Thus, the simulator forms a final structure file having a patterned photo resist layer, which is also referred as a 3-D resist profile.

FIG. 4 illustrates simulated 3-D resist profiles of target features 10 from the layout of FIG. 3 under different process conditions in accordance with embodiments of the invention. FIGS. 4a, 4c, and 4e illustrate 3-D views while FIGS. 4b, 4d, and 4f illustrate cross sectional 2-D views along a selected plane. The following structures are used merely as an illustration, and in various embodiments these may be performed over any type and number of features.

Figure 4A:
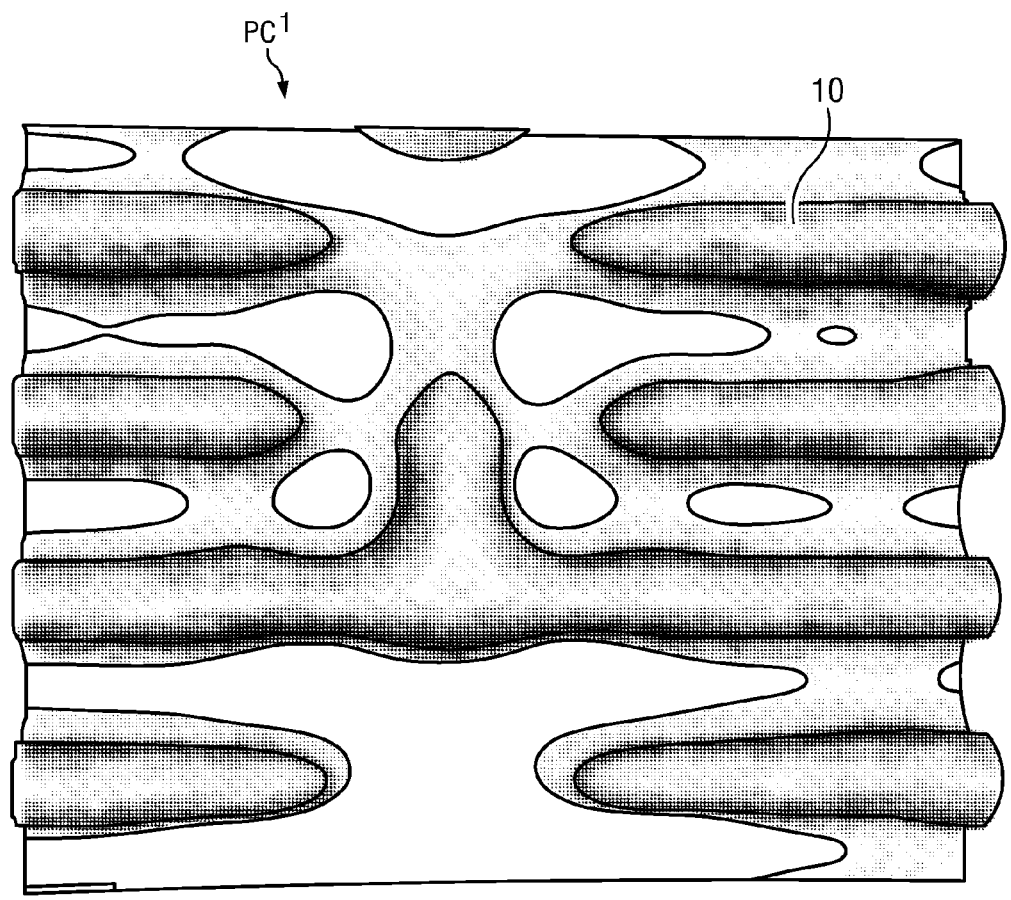
FIGS. 4a-4f, illustrates simulated 3-D resist profiles of target features from the layout of FIG. 3 under different process conditions in accordance with embodiments of the invention.
Figure 4B:
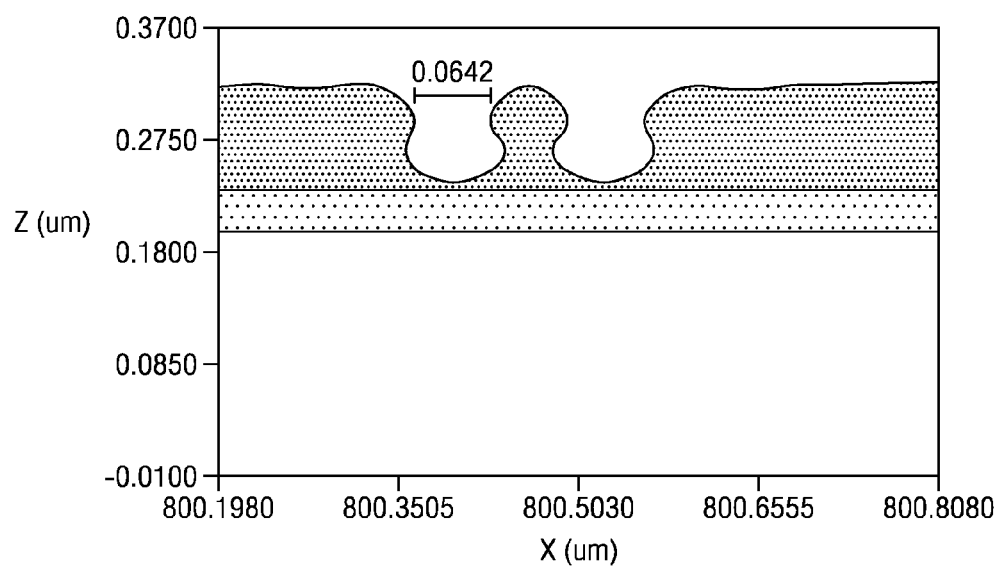
Figure 4C:
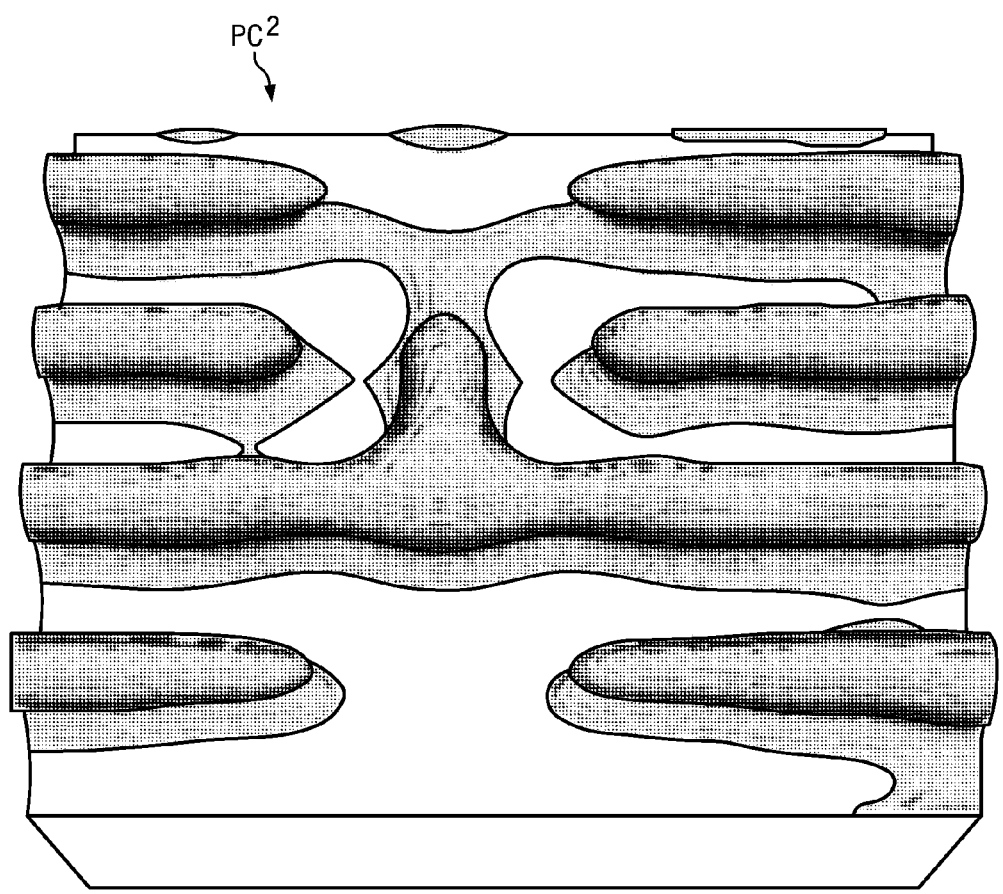
Figure 4D:
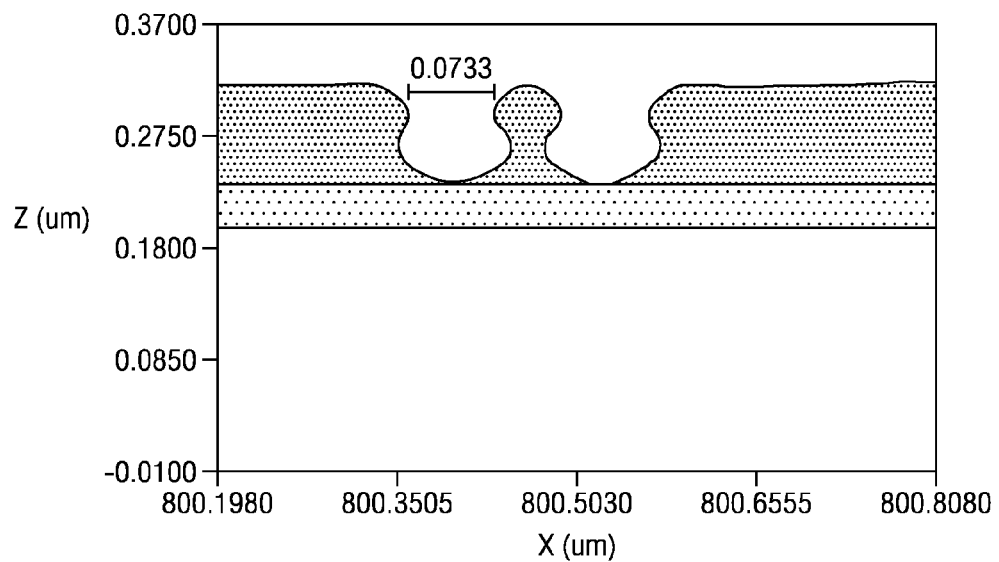
Figure 4E:
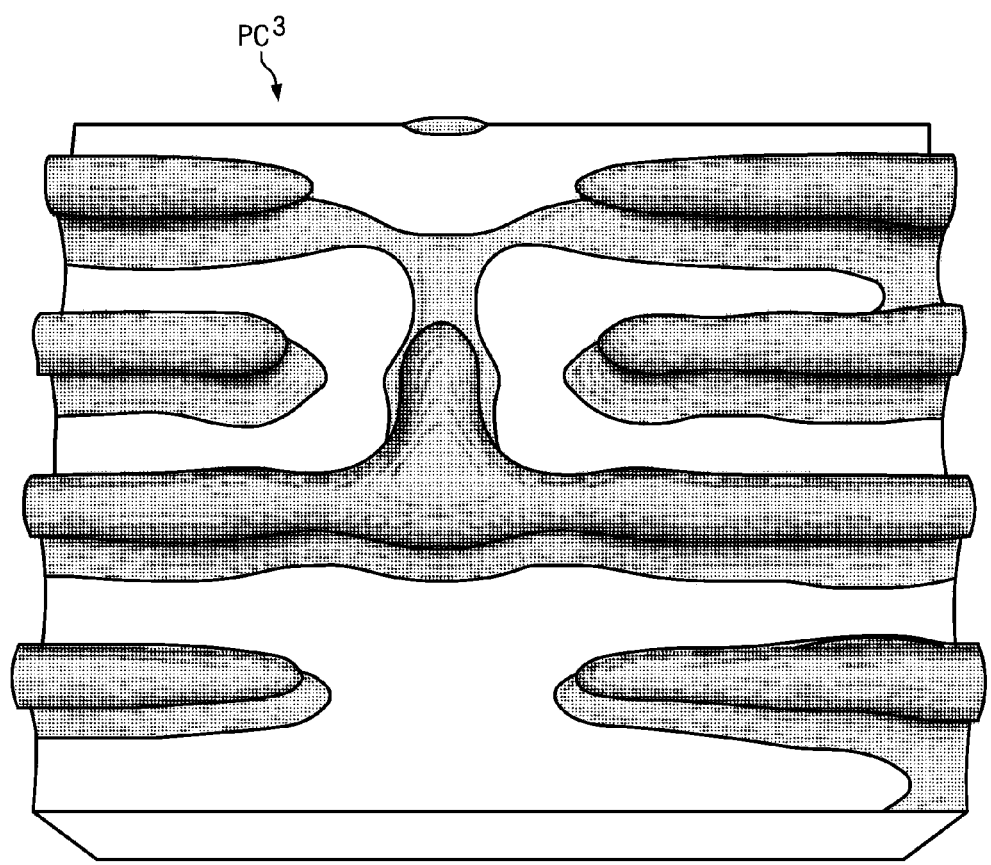
Figure 4F:
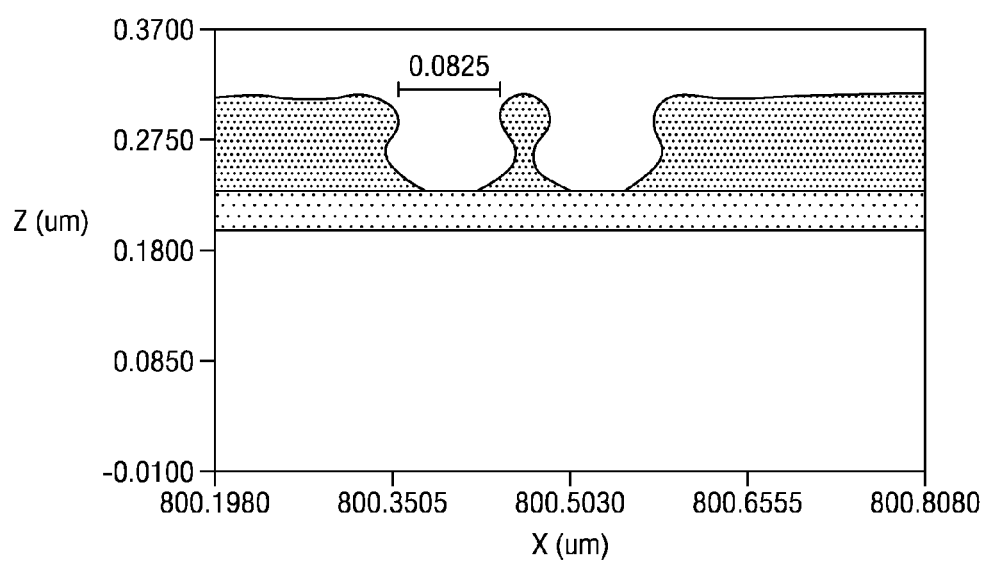

FIGS. 4a and 4b illustrates the resist profile for a first process condition (PC$^1$), FIGS. 4c and 4d illustrates the resist profile for a second process condition (PC$^2$), and FIGS. 4e and 4f illustrates the resist profile for a third process condition (PC$^3$). As an example, the first process condition corresponds to a first process corner, e.g., a low exposure dose, the second process condition corresponds to a center-point, e.g., a optimum exposure dose, and the third process condition corresponds to a third process corner, e.g., a high exposure dose.

As first visualized from the 2-D views of FIGS. 4b, 4d, and 4f, resist bridging may not be identified as a problem if an incorrect plane is chosen. In the illustrated views of FIGS. 4b, 4d, and 4f, there is some suggestion of narrowing of the gaps between the resist but there is no indication of bridging (see e.g., distances marked in these figures). Similarly, visualizing each of the individual 3-D plots can be difficult and time consuming.

In various embodiments, this process is performed at least two process corners generating two different 3-D resist profiles. The process corners may be selected as a two sigma or a three sigma deviation from a target process condition of a process parameter, e.g., $P^1_L$, $P^1_R$, which are the left and right extremes of a first process parameter. For example, although a fabrication process selects a certain exposure dose, due to process variations (e.g., wafer-wafer, die-die, lot-lot variations) some parts of the layout may be exposed to more or less exposure dose. In one embodiment, the process corners are selected to be representative of such process variations. Thus, the two different 3-D resist profiles may represent the two extreme possible resist profiles for that process parameter.

However, in reality, variations include variations in a plurality of process parameters. Further, not all process parameters may be orthogonal. In other words, some process parameters may be coupled to other process parameters. Therefore, in some embodiments, the process corners selected for the two different 3-D resist profiles may have more than one process variation. As an example, a first 3-D resist profile may be simulated using a first process condition and the second 3-D resist profile may be simulated using a second process condition. The first process condition may include two process variables: $P^1_L$ and $P^2_L$. Similarly, the second process condition may include two process variables: $P^1_R$ and $P^2_R$. In various embodiments, each of the process conditions may include more than one process variable.

In other embodiments, 3-D resist profiles are generated for three or more process corners. For example, in one embodiment, a first 3-D resist profile is generated for a first corner, a second 3-D resist profile is generated for a second corner, and third 3-D resist profile is generated for a center-point between the first and the second corners.

In an alternative embodiment, four or five different 3-D resist profiles are generated. In such an embodiment, for example, a first 3-D resist profile is generated for a first corner of a first process variable, a second 3-D resist profile is generated for a second corner of the first process variable, a third 3-D resist profile is generated for a first corner of a second process variable, and a fourth 3-D resist profile is generated for a second corner of the second process variable. An example of the first and the second process variables may be exposure dose and focus.

Figure 5:
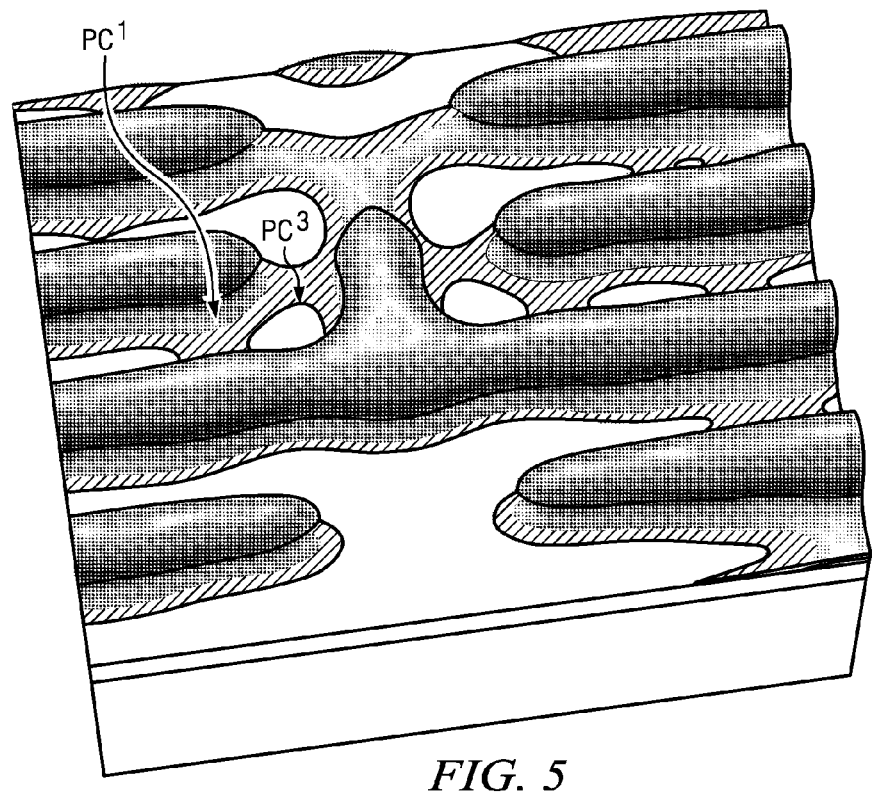
FIG. 5 illustrates a combined 3-D image of the resist profiles of FIG. 4 in accordance with embodiments of the invention.

FIG. 5 illustrates a combined 3-D image of the resist profiles of FIG. 4 formed as described in FIG. 2a in accordance with embodiments of the invention. FIG. 5 illustrates the features 10 from the first process condition (PC$^1$) together with the features 10 from the third process condition (PC$^3$). It is clear that the first process condition results in resist bridging. This process may be scripted within the visualization software so that the visualization software automatically performs these operations and renders the final combined 3-D image for visualization.

Figure 6:
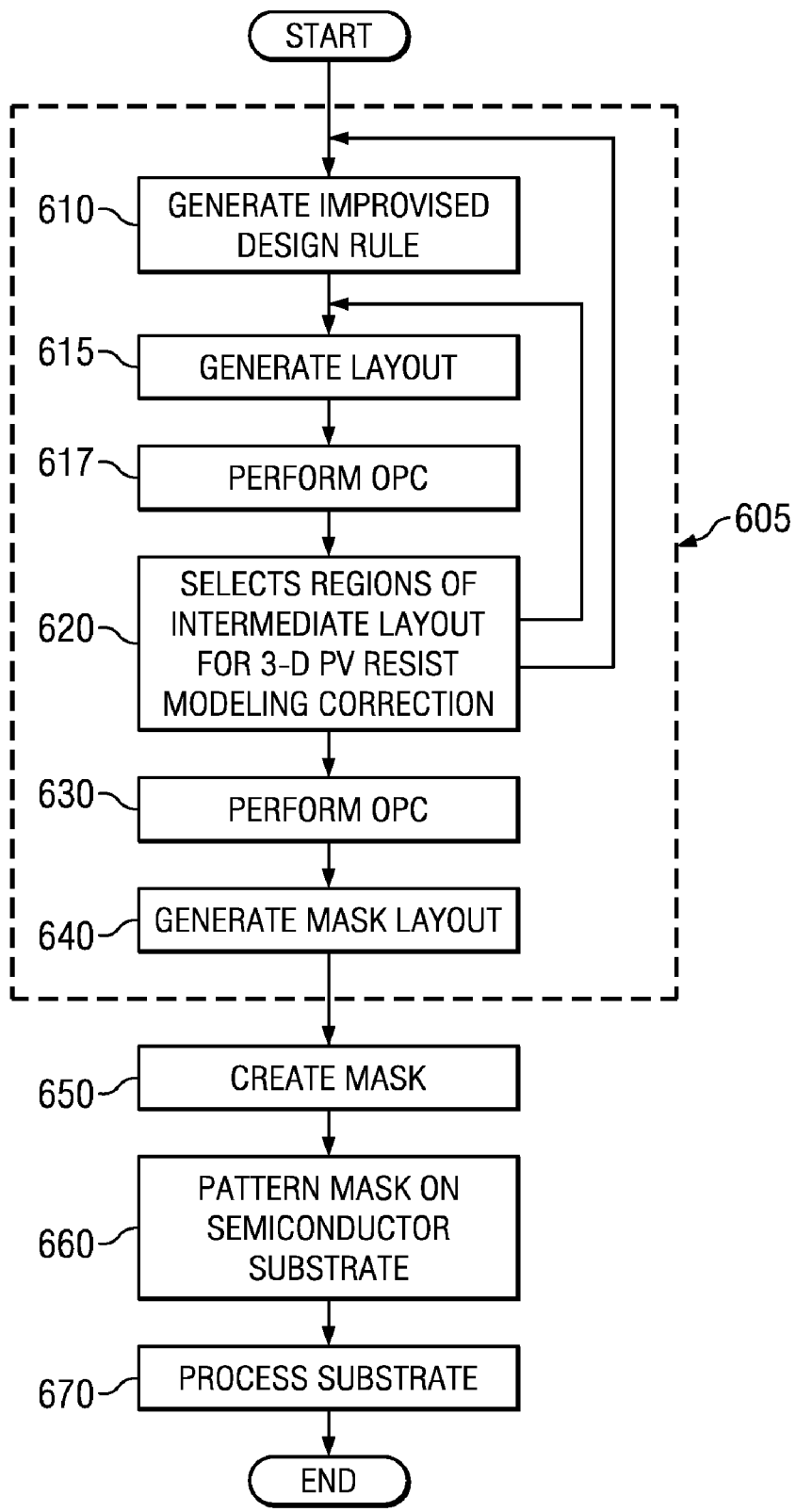
FIG. 6 is a diagram of a sequence of events in the manufacture of a semiconductor device according to embodiments of the present invention.

FIG. 6 is a diagram of a sequence of events in the manufacture of a semiconductor device according to embodiments of the present invention.

FIG. 6 shows a diagram illustrating a sequence of events 600 in the manufacture of an exemplary semiconductor device, wherein the manufacture utilizes a mask designed using an electronic design automation system, and further modified using an OPC system, according to an embodiment of the present invention.

The manufacture of the semiconductor device can begin with the design of a mask(s) (step 605). This process starts with forming improvised ground rules for generating a layout after incorporating corrections after 3-D process variation (PV) resist modeling (step 610) described in FIG. 1. After generating a layout (step 615), as illustrated in step 617, preliminary optical proximity corrections (OPC) calculations may be performed. This may be done to ensure that 3-D features print correctly in the subsequent 3D simulations. Next, the 3-D PV resist modeling may be performed again in selected hotspot regions as described above (step 620). If needed, the layout (and/or ground rules) may be corrected based on the 3-D PV resist modeling (arrows to step 610 and/or step 610). A final OPC (step 630) may follow the resist simulations. In some embodiments, only a single OPC may be performed in step 617 or in step 630. Next, a mask layout is generated (step 640).

This allows 3-D PV resist corrections on the final mask layout.

In various embodiments, the design of the mask can include the use of computer design tools that will take a description of the semiconductor device (in a function description, a physical description, or a combination of both descriptions of the semiconductor device) to create a layout of the semiconductor device. The computer design tools can make use of 3-D PV resist modeling and optical proximity correction to make adjustments to structures of the mask to as closely match a simulated resist profile to the layout of the semiconductor device. The adjustments of the structures of the mask can be based on the use of targets, including visible targets in the layout and targets that affect geometric properties as well as targets that affect physical parameters.

After the mask has been designed, the mask can be created (block 650). The created mask can then be used to create a reproduction of the pattern on a resist layer on an upper surface of a semiconductor substrate (block 660), wherein the created mask can be reproduced onto the resist layer by light or some form of radiation. After patterning, the semiconductor substrate can be processed, such as by etching, to affect the pattern onto the semiconductor substrate (block 670).

Advantageously using embodiments of the invention, expensive wafer patterning with a defective/non-optimized mask and subsequent reworking of the mask is avoided by using the above described embodiments of the invention. This not only saves the expense of fabricating an additional mask and processing, but also saves valuable time spent in accomplishing these steps.

Figure 7:
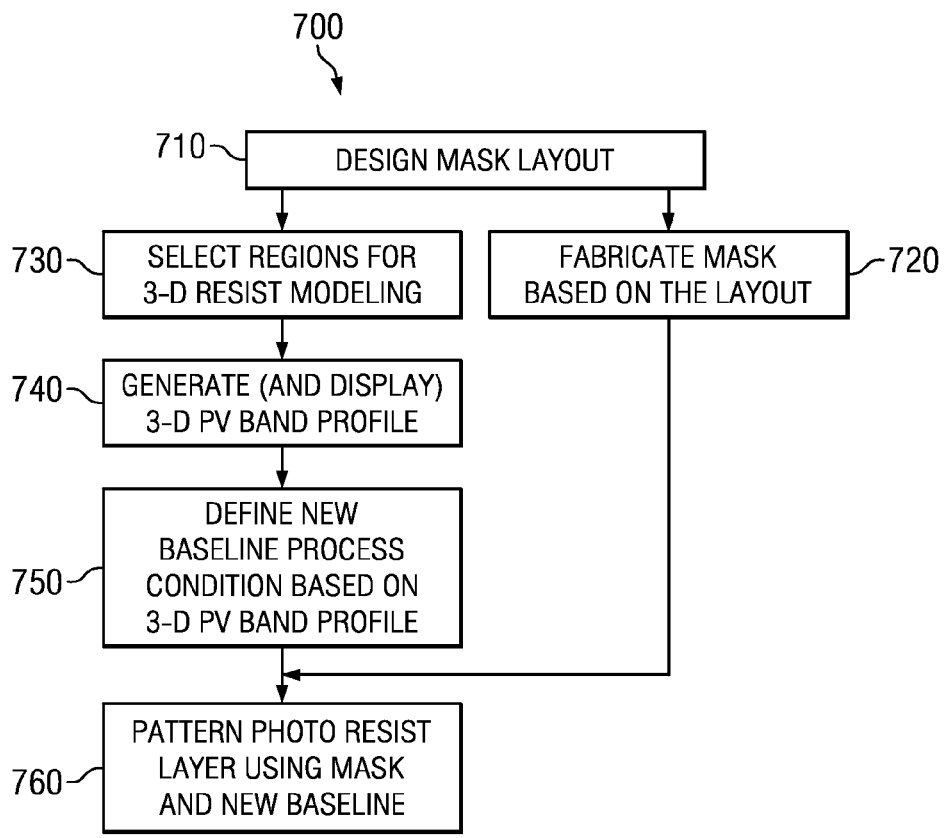
FIG. 7 is a diagram of a sequence of events in the manufacture of a semiconductor device according to embodiments of the present invention.

FIG. 7 is a diagram of a sequence of events in the manufacture of a semiconductor device according to embodiments of the present invention.

FIG. 7 shows a diagram illustrating a sequence of events 700 in the manufacture of an exemplary semiconductor device.

Advantageously, in this embodiment and unlike the embodiment described in FIG. 6, the mask layout is not changed after the 3-D resist modeling. Instead, the process conditions are changed that best works for the given mask.

The manufacture of the semiconductor device can begin with the design of a mask(s) (mask layout in step 710). A mask is generated based on the mask layout (step 720). The mask may be generated after suitable OPC steps. Next hotspot regions are selected for 3-D PV resist modeling (step 730). 3-D resist profiles are generated and combined to form 3-D PV bands (step 740) as described in various embodiments above. The 3-D PV bands may be rendered to a display for visualization.

The process conditions for exposing a photo resist layer may be changed to improve process margin/tolerance (step 750). For example, a new baseline process may be generated by changing one or more of the process variables (such as dose, exposure, resist height etc). This new baseline process may be used for the lithographic process. The mask is next patterned on the semiconductor substrate (step 760) and subsequent processing continues to form a semiconductor device.

Thereby in all embodiments (e.g. embodiments described with respect to FIG. 6 or FIG. 7), an extra mask fabrication/reworking step is avoided saving considerable costs and time in the fabrication of the semiconductor device.

Figure 8:
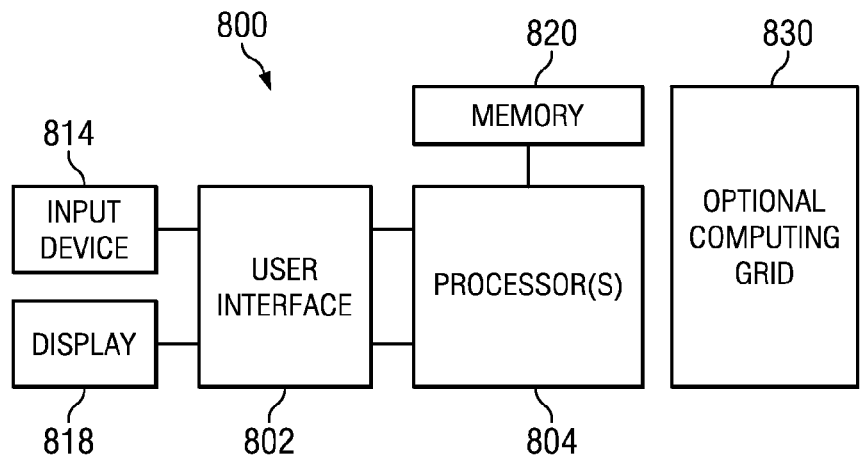
FIG. 8 illustrates a block diagram of a computing unit for implementing embodiments of the invention.

A block diagram of a computing unit including embodiments of the invention is illustrated in FIG. 8. CPU 800 can be, for example, any type of computing unit including desktop units, laptops, hand held devices or network enabled peripheral units.

The CPU 800 includes a processor 804, which may be a single or a multi-core processor. Embodiments of the invention may be implemented as software executed using the processor 804. The CPU may be optionally coupled to other computing units through the optional computing grid 830 in case intensive computing needs to be performed. Thus, the processor 804 may be coupled to a plurality of processors connected through a external grid or an internal network User interface 802 is coupled to processor 804 and provides interfaces to input device 814, and display 818, for example. Alternatively, CPU 800 may have a different configuration with respect to user interface 802, or user interface 802 may be omitted entirely.

The CPU 800 includes memory 820, which may includes both a permanent memory and a volatile memory for performing computing operations. For example, in some embodiments, an executable program implementing embodiments of the invention may be stored in a computer-readable storage medium such as a hard drive, which may be a magnetic or solid state hard drive, as examples. In one or more embodiments, the embodiments of the invention may be implemented as software and stored within the memory 820 of the CPU 800. Alternatively, the software may be stored in an external computer-readable storage medium and introduced into the CPU 800 through the user interface 802.

As an example, the generation of the plurality of 3-D resist profiles may be performed within the processor 804. Subsequently, in one embodiment, a user may use the input device 814 to load the plurality of 3-D resist profiles into the memory of the 820 as part of a visualization program. Next, the user through the input device 814 may generate a combined 3-D process variable band profile, which is displayed through the display 818. In another embodiment, the plurality of 3-D resist profiles are combined digitally to form the 3-D PV band profile. The 3-D PV band profiles is stored within the memory 820 and may be rendered through the display 818.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
   using a processor, generating a first three dimensional (3-D) resist profile for a first process condition using an layout mask of a target structure;
   using a processor, generating a second 3-D resist profile for a second process condition using the layout mask, wherein the first process condition comprises a plurality of process variables, and wherein the second process condition comprises different values of the plurality of process variables than the first process condition;
   generating a 3-D process variable (PV) band profile, wherein generating the 3-D PV band profile comprises combining the first 3-D resist profile with the second 3-D resist profile; and
   displaying a 3-D image of the 3-D PV band profile on a display.

2. The method of claim 1, wherein the plurality of process variables comprise one or more of the group consisting of exposure time, intensity of exposure (dose), focus, mask bias, variations in the resist such as thickness and/or other properties within the resist and other films disposed under and/or over the resist, mask uniformity, line edge placement variations, post develop bake temperature, source non uniformity, numerical aperture variations, and coherence of exposure source.

3. The method of claim 1, further comprising:
   modifying the layout mask based on the displayed 3-D image of the 3-D PV band profile; and
   fabricating a mask for the fabrication of the target structure from the modified layout mask.

4. The method of claim 1, further comprising:
   modifying a baseline process condition for a patterning process based on the displayed image of the 3-D PV band profile; and
   using the modified baseline process condition, patterning a photo resist layer over a workpiece.

5. The method of claim 1, wherein the first and the second 3-D resist profiles are 3-D simulations of lithographic exposure, and development.

6. The method of claim 1, wherein the first process condition and the second process condition comprise opposite corners of a first process variable of the plurality of process variables.

7. The method of claim 6, wherein the first process variable is a variable selected from the group consisting of consisting of exposure time, intensity of exposure (dose), focus, mask bias, variations in the resist such as thickness and/or other properties within the resist and other films disposed over and/or under the resist, mask uniformity, line edge placement variations, post develop bake temperature, source non uniformity, numerical aperture variations, and coherence of exposure source.

8. The method of claim 1, wherein the first process condition comprises a plus two sigma (+2σ) variation from a median of a first process variable of the plurality of process variables, and wherein the second process condition comprises a minus two sigma (−2σ) variation from a median of the first process variable.

9. The method of claim 1, wherein the first process condition comprises a plus three sigma (+3σ) variation from a median of a first process variable of the plurality of process variables, and wherein the second process condition comprises a minus three sigma (−3σ) variation from a median of the first process variable.

10. The method of claim 1, wherein generating a first three dimensional (3-D) resist profile comprises:
    generating a 3-D dimensional representation of a photo resist layer over a workpiece;
    simulating a photolithographic exposure of the photo resist layer through the layout mask;
    simulating time/temperature dependent chemical reactions within the exposed photo resist layer, the chemical reactions impacting the solubility of the photo resist layer in a solvent; and
    simulating the dissolution of a portion of the photo resist layer exposed to the solvent thereby forming the first 3-D resist profile.

11. The method of claim 1, wherein generating the 3-D PV band profile and displaying the 3-D image of the 3-D PV band profile comprises:
    loading the first three dimensional (3-D) resist profile into a memory of a computing unit using a visualization program;
    loading the second 3-D resist profile into the memory of the computing unit using the visualization program; and
    rendering the first 3-D resist profile to be transparent.

12. The method of claim 1, wherein generating a 3-D PV band profile comprises:
    using a mathematical operator to combining the first 3-D resist profile with the second 3-D resist profile.

13. The method of claim 12, wherein the mathematical operator comprises a XOR, a AND, or a NOR operator.

14. The method of claim 1, further comprising:
    identifying a hotspot region of a temporary layout of the target structure using a 2-D simulation; and
    generating the layout mask comprising the hotspot region.

15. The method of claim 1, further comprising:
    using a processor, generating a third three dimensional (3-D) resist profile for a third process condition using the layout mask of the target structure; and
    using a processor, generating a fourth 3-D resist profile for a fourth process condition using the layout mask, the third process condition being different from the first, the second, and the fourth process conditions, the fourth process condition being different from the first and the second process conditions, wherein values of the plurality of process variables for the third process condition are different from the values of the plurality of process variables for the fourth process condition, wherein generating the 3-D PV band profile further comprises combining the third 3-D resist profile and the fourth 3-D resist profile with the first, and the second 3-D resist profiles.

16. The method of claim 15, wherein the first process condition and the second process condition comprise opposite corners of a first process variable of the plurality of process variables, and wherein the third process condition and the fourth process condition comprise opposite corners of a second process variable of the plurality of process variables.

17. A method of manufacturing a lithographic mask, the method comprising:
    using a processor, generating a first three dimensional (3-D) resist profile for a first process condition using an layout mask of a target structure;
    using a processor, generating a second 3-D resist profile for a second process condition using the layout mask, wherein the first process condition comprises a plurality of process variables, and wherein the second process condition comprises different values of the plurality of process variables than the first process condition; and
    in a processor, using a binary operation, generating a 3-D process variation (PV) band profile, wherein generating the 3-D PV band profile comprises combining the first and the second 3-D resist profiles.

18. The method of claim 17, wherein the binary operation is a XOR, a AND, or a NOR operation.

19. The method of claim 17, wherein the simulation region comprised of various binary operation outputs are set to different color/transparency combinations to aid visualization.

20. The method of claim 17, further comprising:
    modifying the layout mask based on the generated 3-D PV ban profile; and
    fabricating a mask for the fabrication of the target structure.

21. The method of claim 17, wherein the first and the second 3-D resist profiles are 3-D simulations of lithographic exposure, development, and etching.

22. The method of claim 17, wherein the first process condition and the second process condition are opposite corners of a first process variable.

23. The method of claim 22, wherein the first process variable is a variable selected from the group consisting of exposure time, intensity of exposure (dose), focus, mask bias, variations in the resist such as thickness and/or other properties within the resist or other films, mask uniformity, line edge placement variations, post develop bake temperature, source non uniformity, numerical aperture variations, and coherence of exposure source.

24. A method of manufacturing a semiconductor device, the method comprising:
    using a processor, generating a plurality of process conditions having a plurality of process variables, wherein each process condition of the plurality of process conditions is different from another process condition of the plurality of process conditions by a value of at least one process variable of the plurality of process variables;
    using a processor, generating a plurality of three dimensional (3-D) resist profiles for the plurality of process conditions using an layout mask of a target structure,
    generating a 3-D process variable (PV) band profile, wherein generating the 3-D PV band profile comprises combining the plurality of 3-D resist profiles; and
    displaying a 3-D image of the 3-D PV band profile on a display.

25. The method of claim 24, wherein the plurality of process variables comprise one or more of the group consisting of exposure time, intensity of exposure (dose), focus, mask bias, variations in the resist such as thickness and/or other properties within the resist, mask uniformity, line edge placement variations, post develop bake temperature, source non uniformity, numerical aperture variations, and coherence of exposure source.

26. The method of claim 24, further comprising:
modifying the layout mask based on the displayed 3-D image of the 3-D PV band profile; and
fabricating a mask for the fabrication of the target structure.

27. The method of claim 24, further comprising:
modifying a baseline process condition for a patterning process based on the displayed 3-D image of the 3-D PV band profile; and
using the modified baseline process condition, patterning a photo resist layer over a workpiece.

28. A non-transitory computer-readable storage medium with an executable program stored thereon, wherein the program instructs a processor to perform the following steps:
generating a first three dimensional (3-D) resist profile for a first process condition using an layout mask of a target structure;
generating a second 3-D resist profile for a second process condition using the layout mask, wherein the first process condition comprises a plurality of process variables, and wherein the second process condition comprises different values of the plurality of process variables than the first process condition; and
generating a 3-D process variation (PV) band profile comprising the first and the second 3-D resist profiles.

29. The computer-readable storage medium of claim 28, wherein generating the 3-D PV band profile comprises:
combining the first 3-D resist profile with the second 3-D resist profile to generate a resultant 3-D resist profile.

30. The computer-readable storage medium of claim 28, wherein generating the 3-D PV hand profile comprises:
using a binary operation to generate an output comprising the first and the second 3-D resist profiles.

31. The method of claim 1, wherein generating a first three dimensional (3-D) resist profile comprises generating a 3-D dimensional representation of a photo resist layer over a workpiece.

32. The method of claim 1, wherein generating a first three dimensional (3-D) resist profile comprises simulating a photolithographic exposure of a photo resist layer through the layout mask.

33. The method of claim 1, wherein generating a first three dimensional (3-D) resist profile comprises simulating time/temperature dependent chemical reactions within an exposed photo resist layer, the chemical reactions impacting the solubility of the exposed photo resist layer in a solvent.

34. The method of claim 1, wherein generating a first three dimensional (3-D) resist profile comprises simulating the dissolution of a portion of a photo resist layer exposed to the solvent.

35. The method of claim 1, wherein generating the 3-D PV band profile and displaying the 3-D image of the 3-D PV hand profile comprises loading the first three dimensional (3-D) resist profile into a memory of a computing unit using a visualization program and loading the second 3-D resist profile into the memory of the computing unit using the visualization program.

* * * * *

UNITED STATES PATENT AND TRADEMARK OFFICE
CERTIFICATE OF CORRECTION

PATENT NO. : 8,359,562 B2  Page 1 of 1
APPLICATION NO. : 13/004562
DATED : January 22, 2013
INVENTOR(S) : Sarma et al.

It is certified that error appears in the above-identified patent and that said Letters Patent is hereby corrected as shown below:

In the Claims:

In Col. 12, line 57, claim 4, after "displayed" insert --3-D--.
In Col. 16, line 4, claim 30, delete "hand" and insert --band--.
In Col. 16, line 24, claim 35, delete "hand" and insert --band--.

Signed and Sealed this
Sixteenth Day of July, 2013

Teresa Stanek Rea
*Acting Director of the United States Patent and Trademark Office*